United States Patent [19]

Adams

[11] Patent Number: 4,603,058

[45] Date of Patent: Jul. 29, 1986

[54] POST-TREATMENT OF CURED, RADIATION SENSITIVE, POLYMERIZABLE RESINS TO ELIMINATE SURFACE TACK

[75] Inventor: William R. Adams, Woodbury, Conn.

[73] Assignee: MacDermid, Incorporated, Waterbury, Conn.

[21] Appl. No.: 658,315

[22] Filed: Oct. 5, 1984

[51] Int. Cl.$^4$ ................................................ B05D 3/06
[52] U.S. Cl. ...................................... 427/54.1; 522/10; 522/14; 522/182; 522/910; 522/902; 522/85; 430/309; 430/331
[58] Field of Search ............... 427/54.1, 35, 44, 36, 427/53.1, 43.1; 430/328, 331, 309, 306; 204/159.22, 159.23

[56] References Cited

U.S. PATENT DOCUMENTS

| | | | |
|---|---|---|---|
| 2,875,047 | 2/1959 | Oster | 204/159.23 |
| 3,097,096 | 7/1963 | Oster | 430/307 |
| 3,279,919 | 10/1966 | Laridon et al. | 430/306 |
| 3,515,657 | 6/1970 | Nakanome et al. | 204/159.22 |
| 3,669,664 | 6/1972 | Adams | 430/309 |
| 3,723,120 | 3/1973 | Hummel | 204/159.14 |
| 4,202,696 | 5/1980 | Takahashi et al. | 430/306 |
| 4,234,676 | 11/1980 | Hein et al. | 430/286 |
| 4,396,284 | 8/1973 | Fromson et al. | 430/328 |
| 4,400,460 | 8/1983 | Fickes et al. | 430/306 |
| 4,415,654 | 11/1983 | Pohl | 430/328 |
| 4,451,553 | 5/1984 | Fickes et al. | 430/306 |

*Primary Examiner*—John H. Newsome
*Attorney, Agent, or Firm*—St. Onge, Steward, Johnston & Reens

[57] ABSTRACT

A process is described for eliminating or substantially reducing the surface tack on relief printing plates and the like articles fabricated from radiation-sensitive polymerizable resins, particularly photopolymerizable resin compositions. The process comprises immersing the article, after curing, in an aqueous solution or dispersion comprising a water-soluble or water dispersible ethylenically unsaturated monomer (acrylic, methacrylic acids and derivatives thereof preferred) and optionally a photoinitiator and exposing the immersed plate to actinic radiation.

23 Claims, No Drawings

POST-TREATMENT OF CURED, RADIATION SENSITIVE, POLYMERIZABLE RESINS TO ELIMINATE SURFACE TACK

BACKGROUND OF THE INVENTION

1. Field of the Invention

This invention relates to an improved process for the surface treatment of polymeric compositions and is more particularly concerned with a process for removing surface tack from articles fabricated from radiation-sensitive polymerizable resins and with the treated articles so prepared.

2. Description of the Prior Art

It is well-recognized in the art that resin compositions which have been polymerised and cured by exposure to actinic or thermal radiation frequently exhibit a stickiness or surface tack which is attributable to incomplete reaction of the reaction components even after curing. This is particularly true of relief printing plates and like articles which are prepared by selective exposure (i.e. via a negative transparency) of parts of the surface of the radiation-sensitive polymerizable resin to appropriate radiation followed by solvent etching of unpolymerized resin to form the relief image. The portions of the resulting surface from which the unreacted resin has been removed by the solvent etching are particularly prone to exhibit tack.

The surface tack exhibited by articles such as those described above causes problems arising from the tendency of the articles to pick up dust, particularly paper dust in the case of relief printing plates, which can interfere with the efficient use of the articles in question. In addition the articles will tend to adhere to each other if stored in piles for any significant length of time.

Various means of overcoming the problem of surface tack have been described. Thus, it has been proposed to provide a thin coating of rubber latex or other such materials on the surface exhibiting tack. Such coatings suffer disadvantageous such as the tendency to lose their effectiveness after extended periods of use, particularly where the treated article is a relief printing plate. Further, such coatings tend to blur the sharpness of any relief image which has been developed on the surface prior to the coating.

U.S. Pat. No. 4,234,676 (Hein et. al.) describes a process for reducing surface tack on a relief printing plate derived from a photopolymerizable resin composition by the inclusion in said composition of a polythiol.

U.S. Pat. No. 4,400,460 (Fickes et. al.) describes the post-treatment of a relief printing plate derived from a photosensitive polymer by the steps, in either order, of post-exposing the plate to a source of actinic radiation and contacting the plate with an aqueous solution containing a source of bromine. U.S. Pat. No. 4,451,553 (Fickes et. al.) describes a closely related post treatment in which the plate is exposed to the action of two successive aqueous solutions the first of which contains a source of bromine or iodine and the second of which contains a source of chlorine.

U.S. Pat. No. 4,415,654 (Pohl) describes post-treatment of a relief printing plate derived from a photosensitive polymer by immersing the cured plate in a dilute aqueous solution of a persulfate salt (e.g. sodium) which solution also contains sufficient of a carboxylic acid (e.g. acetic acid) to provide a pH of about 1.5 to 2.5, and exposing the immersed plate to actinic radiation.

U.S. Pat. No. 4,202,696 (Takahashi et. al.) discloses a method of removing tack from the surface of a free radical polymerized resin composition by impregnating the surface with an organic ketone and exposing the impregnated surface to the action of actinic rays. This procedure, when employed to treat a relief printing plate derived from a photosensitive resin composition, has been found to cause undesirable swelling of the plate.

I have now found that surface tack on relief printing plates and related articles prepared from radiation-sensitive polymeric compositions, can be eliminated, or reduced to acceptable levels, by a simple and effective post-treatment which will be described in detail hereinbelow.

Accordingly, it is an object of the invention to provide an effective and economically advantageous method of eliminating or satisfactorily reducing the surface tack exhibited by an article fabricated from a radation-sensitive polymerizable resin composition. It is another object of the invention to provide an article fabricated from such a polymerizable resin composition which article has a surface substantially free from tack. It is yet a further and particular object of the invention to provide a process for eliminating or satisfactorily reducing the surface tack on a relief printing plate fabricated from a photosensitive resin composition and to thereby provide relief printing plates which can be utilized to make a large number of consecutive impressions without any recurrence of surface tack or deterioration because of exposure to printing inks, solvents and the like used in the printing process.

SUMMARY OF THE INVENTION

This invention comprises a process for removing tack from the surface of a cured radiation sensitive polymerizable resin composition which comprises immersing said composition in an aqueous solution containing a water-dispersible ethylenically unsaturated monomer and optionally a photoinitiator and exposing said resin composition, while immersed in said solution, to actinic radiation.

This invention also comprises articles fabricated from radiation-sensitive polymerizable resin compositions which articles are substantially free from surface tack.

DETAILED DESCRIPTION OF THE INVENTION

The process of the invention can be utilized to reduce or eliminate tack from the surface of articles fabricated from any of the well-known radiation-sensitive polymerizable resin compositions. The latter compositions generally comprise, as the basic components therein, a binder resin, a polymerizable ethylenically unsaturated monomer, and a radiation sensitive initiator. These compositions are cured to the finished polymer state, after appropriate molding or application of the composition to an appropriate substrate, by exposure to radiation which activates the initiator and thereby initiates polymerization of the monomer. The radiation employed can be thermal or actinic depending upon the nature of the initiator. When the radiation-sensitive composition is being employed to produce an article having a relief surface such as a printing plate, the exposure to radiation of the surface in question is made through a negative transparency of the image to be reproduced on the surface. This causes polymerization of the monomer in those areas to which radiation has been transmitted but leaves unpolymerized those areas to which no radiation has been transmitted. In a subsequent operation the material in the unexposed portions of the surface is removed by etching using an appropriate solvent, assisted if necessary by brushing or like techniques, thereby leaving a relief image of polymerized material in those areas to which radiation was transmitted.

Both thermally polymerizable and photopolymerizable resin compositions are known in the art. The latter are more commonly used, particularly in the preparation of relief printing plates and the like. While it is to be understood that the process of the invention can be applied to the surface treatment of products obtained from either type of composition, the process will be illustrated more particularly hereafter by reference to articles prepared from photopolymerizable resin compositions.

As set forth above, radiation-sensitive polymerizable compositions generally comprise a binder resin, a polymerizable ethylenically unsaturated, monomer and a radiation-sensitive initiator. The binder resins which are commonly employed include polyurethanes, unsaturated polyesters, unsaturated polyamides, polyacrylate resins, polymethacrylate resins and like resins which contain groups capable of forming copolymers with the ethylenically unsaturated monomer.

The polymerizable ethylenically unsaturated monomers which are employed in the above compositions can be any of a wide variety known in the art; see, for example, U.S. Pat. Nos. 2,760,863 and 2,948,611 as well as the U.S. Pat. Nos. 4,202,696 and 4,415,654 discussed above. Illustrative of such monomers are the acrylic and methacrylic esters of monohydric and polyhydric alcohols such as methanol, ethanol, propanol, butanol, hexanol, octanol, ethylene glycol, diethylene glycol, triethylene glycol, trimethylene glycol, trimethylolpropane, pentaerythritol, glycerol and the like.

Illustrative of the radiation-sensitive initiators employed in the above compositions are photoinitiators (i.e. initiators which are activated by actinic radiation) such as benzoin, diacetyl, benzoin methyl ether, α-methylbenzoin, α-phenylbenzoin, benzophenone, 2,2-dimethoxyacetophenone, 2,2-diethoxyacetophenone, Michler's ketone, 2-hydroxy-2-methyl-1-phenylpropan-1-one, (4-benzoylbenzyl)trimethylammonium chloride, and the like.

The radiation-sensitive polymerizable resin compositions employed in the art also frequently comprise optional additives such as thermal stabilizing agents, fillers, plasticizers, pigments, antioxidants and the like.

As set forth above, the radiation-sensitive polymerizable resin compositions are cured by exposure to appropriate radiation after being molded or cast into the desired shape of the finished article. Where the finished article is to have a relief surface, as in the case of a relief printing plate, the exposure to radiation takes place through a negative transparency of the image to be reproduced, followed by solvent etching of unpolymerized material as described above. A typical process for the preparation of a printing plate using a polyurethane binder in a photopolymerizable resin composition is set forth in U.S. Pat. No. 3,951,657 at Col. 5, line 32 to Col. 6, line 66, which disclosure is incorporated herein by reference.

In carrying out the process of the invention the cured, polymerized resin composition to be treated in order to control surface tack is immersed in an aqueous solution (contained in an appropriate vessel such as a tray) which solution comprises (a) at least one water-dispersible, polymerizable, ethylenically unsaturated monomer and, optionally but preferably, (b) a photoinitiator. The resin composition, while still immersed in the aqueous solution, is then exposed to actinic radiation for a period of time sufficient to eliminate the surface tack. The latter time period required in any given instance can be readily determined by a process of trial and error.

It is believed that the process taking place during the irradiation step is a photochemical grafting of the polymerizable monomer to the uncured polymer in the resin composition being treated as well as homopolymerization of the monomer. It is to be understood, however, that this theory is offered by way of explanation only and is not to be construed as limiting the scope of this invention in any way whatsoever.

The water-dispersible, polymerizable, ethylenically unsaturated monomers which are employed in accordance with the invention can be any of those known in the art. The term "water-dispersible" is used throughout the specification and claims to mean a monomer which is soluble in water or miscible therewith in a concentration of at least 15 percent by weight. If desired, the aqueous solution employed in the process of the invention can contain minor amounts (i.e. up to about 3 percent by volume) of water-miscible solvents such as methanol, ethanol, acetone, dioxane, dimethylformamide and the like to aid in solubilizing or dispersing those monomers which have relatively low solubility or miscibility with water.

Illustrative of polymerizable ethylenically unsaturated monomers which can be employed in the process of the invention, alone or in mixtures of two or more, are ethylenically unsaturated aliphatic mono- and polycarboxylic acids and derivatives thereof such as the salts, amides and esters thereof. Typical of said acids are acrylic, methacrylic, maleic, fumaric acids and the like. The salts of said acids which are employed in the process of the invention are inclusive of the alkali metal salts (i.e. potassium, sodium and lithium salts), ammonium and amine salts typical of which are the salts with monoalkylamines such as methylamine, ethylamine, propylamine, hexylamine and the like; aralkylamines such as benzylamine, phenethylamine, and the like; alkanolamines such as monoethanolamine, diethanolamine, propanolamine, and the like; and heterocyclic amines such as pyridine, quinoline, pyrrolidine, piperazine, morpholine, and the like.

The esters of the above acids which are employed in the process of the invention are inclusive of the esters formed with mono- and polyhydric alcohols such as methanol, ethanol, propanol, butanol, hexanol, octanol, ethylene glycol, diethylene glycol, triethyleneglycol, trimethylene glycol, trimethylolpropane, pentaerythritol, glycerol, and the like.

The unsaturated monomer is advantageously employed in the aqueous solution used in the process of the invention in an amount within the range of about 1 to about 15 percent by weight, and preferably in an amount within the range of about 2 to about 5 percent by weight. The most appropriate concentration of monomer employed in any given system may vary depending on choice of initiator and like factors.

A preferred group of polymerizable, ethylenically unsaturated monomers for use in the process of the invention encompasses acrylic and methacrylic acids, the salts thereof, the amides thereof, and the esters thereof with monohydric and polyhydric alcohols. Illustrative of the members of this preferred group are acrylic acid, methacrylic acid, methyl methacrylate, ethyl acrylate, n-propyl acrylate, acrylamide, methylacrylamide, N-methylol acrylamide, 2-hydroxyethyl acrylate, 2-hydroxyethyl methacrylate, lauryl methacrylate, 2-hydroxypropyl acrylate, diethylene glycol monoacrylate, dipropylene glycol monoacrylate, polyethylene glycol monoacrylate, and the sodium, potassium and ammonium salts of acrylic and methacrylic acids. Mixtures of two or more such monomers can be employed if desired.

The photoinitiators which are employed in the process of the invention can be any of those commonly employed in the art. A representative list of such photoinitiators has been given above in describing the composition of typical radiation-sensitive polymerizable resins which are employed in the art. A preferred group of photoinitiators employed in the process of the invention is inclusive of 2-phenyl-2,2-dimethoxyacetophenone, 2-phenyl-2,2-diethoxyacetophenone, 2-hydroxy-2-methyl-1-phenylpropan-1-one, 1-(4-dodecylphenyl)-2-hydroxy-2-methylpropan-1one, 2-ethylanthraquinone, phenanthraquinone, 2-t-butylanthraquinone, 1,2-benzanthraquinone, α-methylolbenzoin, and (4-benzoyl benzyl)trimethyl-ammonium chloride. A particularly preferred photoinitiator is 2-hydroxy-2-methyl-1-phenylpropan-1-one.

The photoinitiator is advantageously present in the aqueous solution employed in the invention in an amount within the range of about 0.05 to about 5.0 percent by weight and preferably within the range of about 0.1 to about 0.5 percent by weight. The most appropriate concentration of photoinitiator to be employed in any given instance will vary depending upon the nature of the polymerizable monomer employed in combination therewith. The most advantageous concentration of photoinitiator and polymerizable monomer to employ with any given combination of these components can be readily determined by a process of trial and error.

The aqueous solution in which the resin compositions are immersed during the irradiation step of the process can also include, as an optional component, a surfactant to promote thorough wetting of the surface to be treated. Any of the surfactants known in the art for use as wetting agents can be employed provided only that the surfactant is compatible with the polymerizable monomer also present in the solution. Illustrative of surfactants are linear alkylbenzene sulfonates, alcohol ether sulfates, alcohol ethoxylates, alcohol sulfates, alpha olefin sulfonates, alkyl phenol ethoxylates, lignosulfonates, petroleum sulfonates, acetylenic alcohols and diols, fluorocarbons, phosphate esters, quaternary alkylamines and silicones. The surfactant, when used, is advantageously present in an amount of the order of about 0.01 to about 0.3 percent by weight.

It has also been found that the rate at which the irradiation process proceeds can be accelerated in many instances by the inclusion in the aqueous solution of a tertiary amine in an amount in the range of about 0.1 to about 1.0 percent by weight. Illustrative of amines which produce this result are N-methyldibutylamine, N-methyldiethanolamine, N-ethyldiethanolamine, N-ethyldiisopropyl amine, triethanolamine, and the like.

In carrying out the irradiation step of the process of the invention any appropriate source of radiation can be employed. Such sources include carbon arcs, mercury vapor lamps, fluorescent lamps, argon glow lamps, photographic flood lamps, tungsten lamps, xenon lamps, pulsed xenon lamps and the like. Preferably the source of radiation is one which generates light of a wavelength within the range of about 300 nm to about 400 nm.

The depth of aqueous liquid, through which the radiation is required to pass in order to reach the surface of the immersed printing plate or other article being treated in the process of the invention, is not critical. As will be apparent to one skilled in the art the depth of liquid in question should not be excessive in order to avoid needless dissipation of energy from the source of radiation and to minimize homopolymerization of the monomer in the bath. In general, the distance separating the surface to be treated from the source of radiation should lie within the range of about 0.1 inches to 3.0 inches. The most appropriate depth to be employed in any given instance can be determined readily by a process of trial and error. In an alternative, but less preferred, embodiment of the process of the invention the article to be treated is not immersed in the aqueous solution during irradiation but the surface to be treated is sprayed or otherwise wetted with aqueous solution and then irradiated.

The period of time for which the exposure to radiation is continued in order to achieve the desired result of elimination of surface tack will obviously vary depending upon a number of factors including the particular article being treated and the nature and concentrations of the polymerizable monomer and the photoinitiator employed. Thus, times as short as 1 minute and as long as 10 minutes have been found to be satisfactory. The most appropriate exposure time to use in any given instance can be determined by a process of trial and error.

The presence of surface tack or the absence thereof can be determined readily by touching the surface in question with the finger tip and one reasonably skilled in the art can readily classify the amount of tack present in a semi-quantitative manner (e.g. by rating the surface on a scale of 1 to 5 in which 1 is tack free and 5 is very tacky). This finger tip test was employed in the specific Examples set forth below. If desired, more objective tests can be applied such as the toilet tissue test described in U.S. Pat. No. 4,400,460 at Col. 14 lines 55–64. However, the finger tip test is entirely adequate to determine the absence of tack when making the determination of the exposure time necessary to remove surface tack from a given specimen using the process of the invention.

When the irradiation of the surface of the cured radiation-sensitive polymerizable resin has been completed as described above, the resulting product is removed from the bath of aqueous solution and is dried, optionally after rinsing with water or other appropriate liquid, in any appropriate manner. It is found that the process of the invention does not affect the desirable properties of the resin in any significant manner. This is particularly important in the case of relief printing plates where any distortion, swelling or deterioration of desirable structural strength properties and the like could have serious consequences as far as utility of the product is concerned.

The relief printing plates which have been treated in accordance with the invention have been found to retain their tack free properties throughout usage for many thousands of impressions. In addition, the treated plates exhibit no evidence of deterioration due to the action of printing inks, solvents and the like to which they are exposed in such usage.

The following examples describe the manner and process of making and using the invention and set forth the best mode contemplated by the inventor of carrying out the invention but are not to be construed as limiting.

EXAMPLE 1

A urethane oligomer based prepolymer was prepared as follows: 472.9 g. of a polyetherdiol (Voranol 2140: Dow Chemical Co.) having an average molecular weight of 4,000 was reacted with 35.8 g. of toluene diisocyanate in the presence of 0.06 g. of dibutyltin dilaurate at 65° C. for 1.5 hours under a nitrogen atmosphere. The nitrogen atmosphere was converted to a dry air system and 20.5 g. of hydroxyethyl acrylate and 1.08 g. of hydroquinone was added over a 1.0 hour period at 75° C. to give a prepolymer with a Brookfield viscosity of 78,000 cps. at 25° C. using a No. 6 spindle at 2.5 rpm. The number average molecular weight was 19,300.

To 200 g. of the above prepolymer was added 40 g. of hydroxyethyl methacrylate, 30 g. of n-butyl acrylate, 5 g. of acrylamide and 40 g. benzoin ethyl ether. The mixture was stirred at room temperature for 30 minutes. The Brookfield viscosity was 8000 cps. at 25° C. using a No. 3 spindle at 2.5 rpm.

A photopolymer relief printing plate prepared from this composition was exposed using two banks of 40 watt ultraviolet fluorescent lamps. A transparency bearing image was covered with a 1 mil thick polypropylene film and placed on a transparent glass sheet. The above photopolymer formula was poured over the polypropylene film (final thickness was approximately 100 mils) and covered with a 4 mil thick polyester film. The first exposure (90 seconds) was made using the bank of lamps located above the polyester film. This formed a relief printing plate background by hardening about 50 mils of the photopolymer. The second exposure (180 seconds) was made through the transparency using the lower bank of lamps. This exposure resulted in the formation of a relief image.

The polypropylene sheet was removed and the non-exposed portions of the photopolymer formula were washed away with water containing an alkylphenol ethoxylate surfactant. The plate was very tacky—tack level of 5 by the finger tip test, supra.

EXAMPLE 2

A photopolymer plate prepared in accordance with Example 1 was totally immersed at a depth of 2 inches in a tray containing an aqueous solution of 10% by weight of acrylic acid and 0.5% by weight of 2-hydroxy-2-methyl-1-phenyl-propan-1-one. While immersed in this solution, the plate was exposed beneath a bank of ultraviolet fluorescent lamps at a distance of 1.5 inches above the liquid surface for 10 minutes at ambient temperature (ca 20° C.). The plate was removed from the bath, dried, and inspected. The plate was free of tack—tack level 1 as determined by the finger tip method.

EXAMPLES 3-6

In a manner identical to Example 2, developed printing plates prepared in accordance with Example 1 were immersed in a variety of solutions and exposed to actinic radiation. The composition of the solutions, exposure times, etc. and results are shown in Table I.

TABLE I

| Ex. No. | Additive (10% by Wt. in Water) | Photosensitizer (0.6% by Wt.) | Post Exp. Time (Mins.) | Tack Level |
|---|---|---|---|---|
| 3 | Acrylic Acid | 2-hydroxy-2-methyl-1-phenyl-propan-1-one | 10 | 1 |
| 4 | None | 2-hydroxy-2-methyl-1-phenyl-propan-1-one | 10 | 5 |
| 5 | Acrylic Acid | None | 10 | 3 |
| 6 | Acrylic Acid | 2-hydroxy-2-methyl-1-phenyl-propan-1-one | 0 | 5 |

COMPARISON EXAMPLES 7-9

Developed printing plates prepared as described in Example 1 were immersed in inorganic detack solutions typical of those employed in the prior art, and processed according to Example 2. The results are shown in Table II.

TABLE II

| Ex. No. | Additive (10% by Wt. in Water) | Photo-sensitizer | Post Exp. Time (Mins.) | Tack* Level |
|---|---|---|---|---|
| 7 | Sodium Bisulfate | None | 10 | 5 |
| 8 | Sodium Persulfate | None | 10 | 5 |
| 9 | Potassium Bromate/ Potassium Bromide/ Hydrochloric Acid | None | 10 | 5 |

*Finger tip test

EXAMPLES 10-14

Photopolymeric plates prepared according to Example 1 were subjected to the detack process of Example 2 using a range of concentrations of acrylic acid, photosensitizer and exposure times. The results are shown in Table III.

TABLE III

| Ex. No. | Acrylic Acid (% by wt.) | [1]Photo-sensitizer (% by wt.) | [2]Distance from Light Source (inches) | Post Exp. Time (Min.) | [3]Tack Level |
|---|---|---|---|---|---|
| 10 | 10 | 0.6 | 1.5 | 5 | 1 |
| 11 | 10 | 0.6 | 3 | 10 | 1 |
| 12 | 5 | 0.6 | 1.5 | 10 | 1 |
| 13 | 20 | 0.6 | 1.5 | 5 | 1 |
| 14 | 10 | 0.6 | 1.5 | 10 | 1 |

[1]2-hydroxy-2-methyl-1-phenyl-propan-1-one
[2]Distance from light source to surface of plate
[3]Finger tip test

EXAMPLES 15-29

Developed printing plates prepared in accordance with Example 1 were immersed in aqueous acrylic acid solutions containing a variety of organic photosensitizers and processed according to Example 2. The results are shown in Table IV.

TABLE IV

| Ex. No.* | Photo-sensitizer | Compatibility** | Tack Level (Finger-tip Test) |
|---|---|---|---|
| 15 | None | — | 5 |
| 16 | 2-hydroxy-2-methyl-propan-1-one | C | 1 |
| 17 | Benzophenone | I | 4 |
| 18 | Daracur 953[2] | I | 4 |
| 19 | DEAP[3] | C | 1 |
| 20 | Uvitone 8302[4] | I | 1 |
| 21 | Quantacure BEA[5] | C | 5 |
| 22 | Daracur 1664[6] | I | 1 |
| 23 | α-methylol benzoin | I | 1 |
| 24 | Irgacure 651[7] | I | 1 |
| 25 | Quantacure PDO[8] | I | 1 |
| 26 | Vicure 55[9] | I | 5 |
| 27 | Irgacure 184[10] | I | 2 |
| 28 | Daracur 2273[11] | I | 1 |
| 29 | Vicure 30[12] | I | 4 |

*Solutions contain 10.1% by weight acrylic acid, 0.6% by weight photosensitizer in water.
Each solution was exposed to actinic radiation for 5 minutes.
**C = Compatible - soluble or miscible with water.
I = Incompatible - insoluble or immiscible with water.
[1]1-(4-dodecylphenyl)-2-hydroxy-2-methylpropan-1-one: E. M. Chemicals
[2]2,2-diethoxyacetophenone
[3]2,2-diethoxy-2-phenylacetophenone: Upjohn
[4]2-(n-butoxy)ethyl-4-dimethylaminobenzoate: Aceto Chemical Co. Inc.
[5]Photoinitiator combination consisting of arylic ketones: E. M. Chemicals
[6]2,2-diethoxy-2-phenylacetophenone: Ciba-Geigy Corporation
[7]1-phenyl-1,2-propanedione-e-(O—ethoxy-carbonyl)oxime: Aceto Chemical Co., Inc.
[8]methyl phenylglyoxylate: Stauffer Chemical Co.
[9]1-hydroxycyclohexyl phenyl ketone: Ciba-Geigy Corporation
[10]Daracur 2273: Photoinitiator combination consisting of arylic ketones and a tertiary aliphatic amine: E. M. Chemicals
[11]Isopropyl benzoin ether: Stauffer Chemical Co.

EXAMPLES 30-34

Developed printing plates prepared in accordance with Example 1 were immersed in a variety of solutions all of which contained 0.6% by weight of 2-hydroxy-2-methyl-1-phenyl-propan-1-one and were processed according to Example 2. The results are shown in Table V.

TABLE V

| Ex. No. | Additive (10% by Wt. in Water) | Post Exposure Time (Mins.) | [1]Tack Level |
|---|---|---|---|
| 30 | Acrylic Acid | 10 | 1 |
| 31 | Hydroxyethyl Methacrylate (HEMA) | 10 | 5[2] |
| 32 | Acetic Acid | 10 | 4 |
| 33 | Oxalic Acid | 10 | 5 |
| 34 | Itaconic Acid | 10 | 5 |
| 35 | β-Mercapto-propionic Acid | 10 | 5 |
| 36 | Adipic Acid | 10 | 5 |
| 37 | Thioglycerol | 10 | 4 |
| 38 | N,N—Dimethylacrylamide | 10 | 3 |
| 39 | Methacrylic Acid | 10 | 1 |
| 40 | Polyethylene Glycol (600) Dimethacrylate | 10 | 2 |
| 41 | Ethoxylated (HEM-70) HEMA | 10 | 3 |
| 42 | Hydroxypropyl Acrylate | 10 | 3 |
| 43 | Methyldiethylamine | 10 | 3 |

[1]Finger tip test
[2]Homopolymerization believed to occure faster than graft polymerization.

EXAMPLE 44

A photopolymeric plate prepared according to Example 1 was subjected to the detack process of Example 2 except that 0.8% by weight of N-methyldiethanolamine was added to the detack solution. The plate was found to be tack-free after post-exposure time of three minutes.

EXAMPLE 45

A photopolymeric plate prepared according to Example 1 was subjected to the detack process of Example 2 except that 0.2% by weight of a surfactant known as Surfonyl SE*, sold by Air Products and Chemicals, Inc. was added to the solution. The dried plate was found to be tack-free.

*: an acetylenic diol

EXAMPLE 46

A photosensitive prepolymer was prepared from a carboxy terminated butadiene/acrylonitrile copolymer, the diglycidyl ether of Bisphenol A and glycidyl methacrylate. 734.8 g. (0.3725 equivalents) of a carboxy terminated butadiene/acrylonitrile copolymer (Hycar CTBN 1300X8 sold by B. F. Goodrich) with an acid number of 28.44, 46.3 g. (0.24 equivalents) of the diglycidyl ether of Bisphenol A (Araldite 6010 sold by Ciba-Geigy) and 1.70 g. of N,N-dimethylbenzylamine catalyst were added to a 1 liter—3 necked flask equipped with a stirrer, a thermometer and a gas inlet tube. The flask was heated to 100° C. under a nitrogen atmosphere for three hours. The acid number at this point was 9.4.

The nitrogen sparge was switched to dry air and a solution of 29.2 g. (0.205 equivalents) of glycidyl methacrylate, 1.95 g. of 2,6-di-tert-butyl-p-cresol and 0.039 g. of phenothiazine was added to the reaction flask. The reaction was maintained at 100° C. for several hours until the acid number reached approximately 2.7.

129 g. of the above prepolymer was stirred with 60 g. lauryl methacrylate, 12 g. 1,3-butylene glycol dimethacrylate and 1.2 g. of 2,2-dimethoxy-2-phenylacetophenone at room temperature for 30 minutes. The Brookfield viscosity was 59,200 cps. at 70° F. using a No. 5 spindle at 2.5 rpm.

A photopolymeric printing plate using this composition was prepared according to the method of Example 1. The surface of the plate was very tacky—tacky level 5 by finger tip test.

EXAMPLE 47

The photopolymeric plate of Example 46 was subjected to the process of Example 2. After drying, the plate was observed to be free of tack.

What is claimed is:

1. A method of removing tack from the surface of a cured radiation-sensitive polymerizable resin composition which comprises the steps of immersing said composition in an aqueous solution comprising a water-dispersible polymerizable ethylenically unsaturated monomer and exposing said composition, while immersed in said solution, to actinic radiation.

2. A method according to claim 1 wherein said aqueous solution also contains a photoinitiator.

3. A method according to claim 1 wherein said aqueous solution also comprises an amine.

4. A method according to claim 1 wherein said aqueous solution also comprises a surfactant.

5. A method according to claim 1 wherein said water-dispersible ethylenically unsaturated monomer comprises at least one member selected from the group consisting of acrylic and methacrylic acids and the salts, amides and esters thereof.

6. A method according to claim 5 wherein said water-dispersible ethylenically unsaturated monomer is acrylic acid.

7. A method according to claim 2 wherein said photoinitiator is selected from the group consisting of 2-phenyl-2,2-dimethoxyacetophenone, 2-phenyl-2,2-diethoxyacetophenone, 2-hydroxy-2-methyl-1-phenylpropan-1-one, 1-(4-dodecylphenyl)-2-hydroxy-2-methylpropan-1-one, 2-ethylanthraquinone, phenanthraquinone, 2-t-butylanthraquinone, 1,2-benz-anthraquinone, α-methylolbenzoin and (4-benzoyl benzyl)trimethyl-ammonium chloride.

8. A method according to claim 7 wherein said photoinitiator is 2-hydroxy-2-methyl-1-phenylpropan-1-one.

9. A method according to claim 1 wherein said actinic radiation is a derived from a source which generates light of a wavelength within the range of about 300 nm. to about 400 nm.

10. A method according to claim 1 wherein said cured radiation-sensitive resin composition is a relief printing plate fabricated from a photopolymerizable resin.

11. A method according to claim 1 wherein the water-dispersible polymerizable monomer is present in said aqueous solution in an amount within the range of about 1 to about 15 percent by weight.

12. A method according to claim 11 wherein said monomer is present in an amount within the range of about 2 to about 5 percent by weight.

13. A method according to claim 2 wherein the photoinitiator is present in said aqueous solution in an amount within the range of about 0.05 to about 5.0 percent by weight.

14. A method according to claim 13 wherein said photoinitiator is present in an amount within the range of about 0.1 to about 0.5 percent by weight.

15. A method of removing surface tack from a relief printing plate which has been fabricated from a photosensitive polymeric composition, said method comprising the steps of
immersing said plate in an aqueous solution comprising a water-dispersible polymerizable ethylenically unsaturated monomer and a photoinitiator; and
exposing said plate, while immersed in said aqueous solution, to actinic radiation.

16. A method according to claim 15 wherein said aqueous solution also comprises an amine.

17. A method according to claim 15 wherein said aqueous solution also comprises a surfactant.

18. A method according to claim 15 wherein said water-dispersible polymerizable ethylenically unsaturated monomer comprises at least one member selected from the group consisting of acrylic and methacrylic acids and the salts, amides and esters thereof.

19. A method according to claim 18 wherein said monomer is acrylic acid.

20. A method according to claim 15 wherein said photoinitiator is selected from the group consisting of 2-phenyl-2,2-dimethoxyacetophenone, 2-phenyl-2,2-diethoxyacetophenone, 2-hydroxy-2-methyl-1-phenylpropan-1-one, 1-(4-dodecylphenyl)-2-hydroxy-2-methylpropan-1-one, 2-ethylanthraquinone, phenanthraquinone, 2-t-butylanthraquinone, 1,2-benz-anthraquinone, α-methylolbenzoin and (4-benzoyl benzyl)trimethyl-ammonium chloride.

21. A method according to claim 20 wherein said photoinitiator is 2-hydroxy-2-methyl-1-phenylpropan-1-one.

22. A method according to claim 15 wherein said aqueous solution comprises from about 2 to about 5 percent by weight of acrylic acid and from about 0.01 to about 0.5 percent by weight of 2-hydroxy-2-methyl-1-phenylpropan-1-one.

23. A relief printing plate free from surface tack and prepared in accordance with the process of claim 15.

* * * * *